United States Patent [19]

Wood

[11] Patent Number: 5,064,377
[45] Date of Patent: Nov. 12, 1991

[54] COMPRESSION CONTACT ELECTRICAL CONNECTOR ASSEMBLY FOR A DISC DRIVE

[75] Inventor: Roy L. Wood, Yukon, Okla.

[73] Assignee: Seagate Technology, Inc., Scotts Valley, Calif.

[21] Appl. No.: 635,771

[22] Filed: Dec. 28, 1990

[51] Int. Cl.$^5$ .............................................. H01R 9/09
[52] U.S. Cl. ..................................... 439/67; 361/398; 439/77; 439/493; 439/329
[58] Field of Search ...................... 439/65, 67, 73, 77, 439/329, 492, 493, 499; 361/398

[56] References Cited

U.S. PATENT DOCUMENTS 4,923,406  5/1990  Bucknam ............................. 361/398
4,929,183  5/1990  Rinneburger ......................... 439/67
4,948,374  8/1990  Carter .................................. 439/67

Primary Examiner—Paula A. Bradley
Attorney, Agent, or Firm—Flehr, Hohbach, Test, Albritton & Herbert

[57] ABSTRACT

The present invention is a compression connection apparatus for electrically connecting a disc drive motor to electronic signal sources. The apparatus comprises a circuit board attached to a disc drive motor having a pattern of metal contacts and each metal contact is attached to the internal motor electronics, a flexible printed circuit cable attached to the disc drive assembly's base deck having a pattern of metal contacts matching the metal contacts on the motor mounted circuit board, and a means for providing compressive force to maintain conductive contact between the aforementioned metal contacts.

12 Claims, 3 Drawing Sheets

COMPRESSION CONTACT ELECTRICAL CONNECTOR ASSEMBLY FOR A DISC DRIVE

The present invention relates generally to disc drive systems and particularly to an improved connector assembly for connecting a disc drive motor to a source of motor drive signals.

BACKGROUND OF THE INVENTION

The present invention is an improvement in a disc drive motor connector assembly. Specifically, the improvement is achieved by using a compression contact assembly.

In general, a disc drive contains one or more discs capable of magnetically storing information. The information is read and written to specific locations on the disc or discs using magnetic transducers, commonly known as heads, that "fly" above the disc surface. Head positioning apparatus is provided in the form of an actuator arm assembly.

Typically, the discs are rotated at a relatively high speed by a brushless DC motor. In contemporary disc drives, the disc drive motor is designed to be the hub of the discs. To maintain a clean room environment surrounding the discs such that the heads and the disc surface do not become contaminated, a sealed chamber encompasses the discs, the actuator assembly and the disc drive motor.

To maintain the integrity of the clean room environment, a multitude of cabling arrangements have been developed. A recent development for providing a sealed interface for the actuator arm assembly signals is disclose in a patent application entitled "Actuator Arm Assembly Printed Circuit Cable to External Printed Circuit Board Interface Apparatus", U.S. Ser. No. 07/611,189, filed Nov. 9, 1990.

Traditionally, the signals used to drive the motor and sense the motor's position were connected via either flex cables or discrete wires soldered to the internal motor electronics, i.e., stator windings and rotor position sensing circuitry. In most instances, today's sealed, fixed shaft motors provide access to the internal electronics through a port or slot in the fixed shaft. Or if a rotating shaft motor is used, the signals are passed through the chassis beneath the motor. In either instance, the wiring becomes an integral part of the motor and must be carefully handled in testing, shipping, and disc drive assembly to avoid breaking the delicate connections within the motor. Also, during disc drive assembly, special wiring methods and apparatus must be used to carefully thread the wires through the basedeck and to keep the wiring from contacting the discs. These special methods add labor costs, and the apparatus adds material costs to the overall production cost of the disc drive.

An objective of the current connector design is to eliminate the attachment of wires or cables which are permanently attached to the internal electronics of the motor and dangle therefrom until installed in the disc drive assembly. In other words, a self contained motor without dangling cables or wires is desired.

Another objective is to provide a solderless connector assembly between the motor and its external support circuitry.

Another objective is to provide a connector assembly which simplifies disc drive motor installation into the disc drive assembly. This occurs by eliminating the soldered installation and by not having a port exiting the base of the fixed shaft in a fixed shaft motor. Without the port exiting the base of the shaft, a single fastener can be used to attached the motor to the base deck of the disc drive assembly.

SUMMARY OF THE INVENTION

In summary, the present invention is a compression connection apparatus for electrically connecting a disc drive motor to electronic signal sources. The apparatus comprises a circuit board attached to a disc drive motor having a pattern of metal contacts and each metal contact is attached to the internal motor electronics, a flexible printed circuit cable attached to the disc drive assembly's base deck having a pattern of metal contacts matching the metal contacts on the motor mounted circuit board, and a means for providing compressive force to maintain conductive contact between the aforementioned metal contacts.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
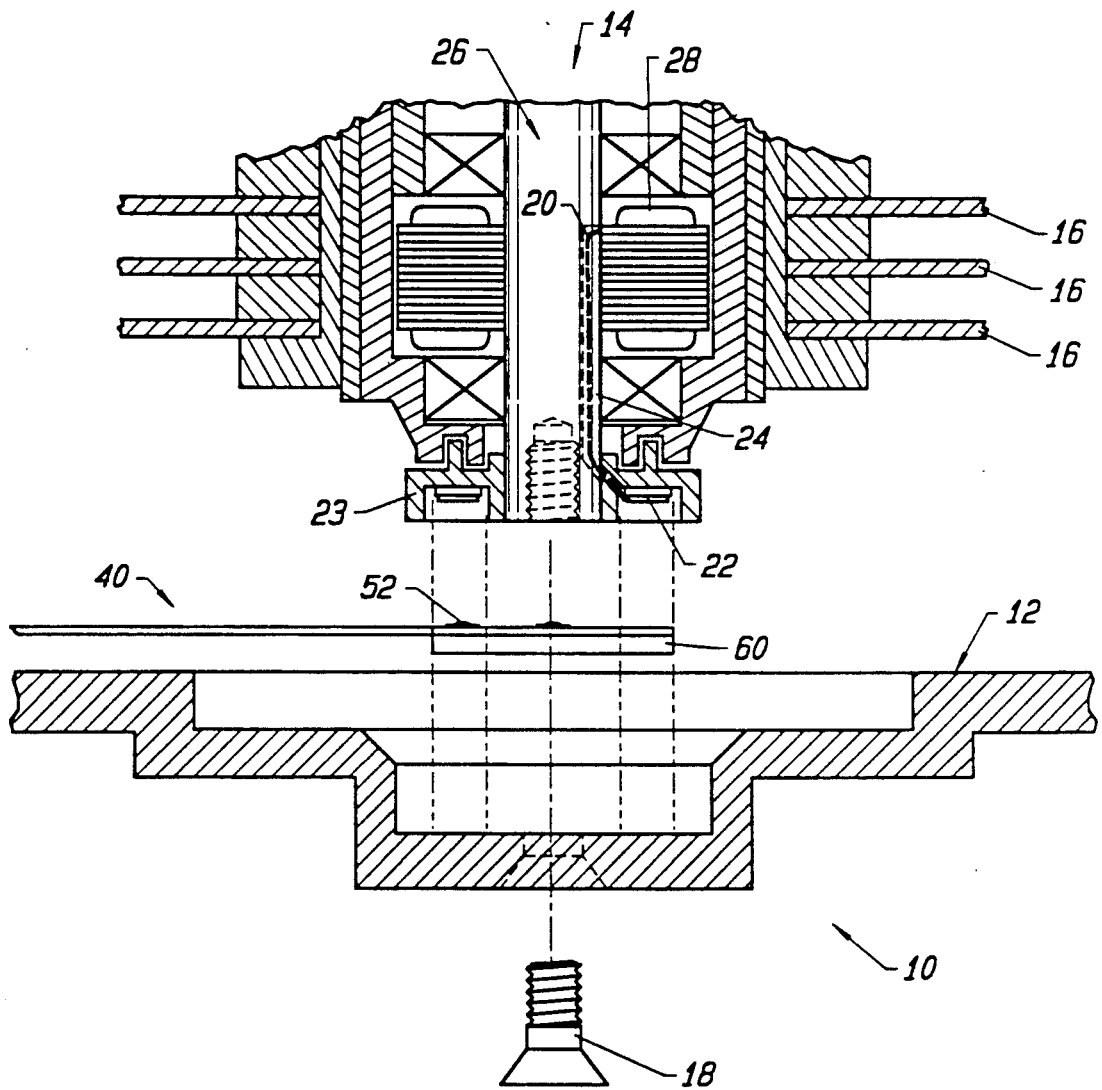
FIG. 1 is an exploded cross sectional view of a disc drive assembly incorporating the preferred embodiment of the invention.

Referring to FIG. 1, there is shown an exploded sectional view of a disc drive assembly 10 incorporating the preferred embodiment of the invention. The disc drive assembly 10 comprises a base deck 12, a disc drive motor 14, at least one disc 16, and a means 18 by which the motor is mounted to the base deck 12.

The motor 14 depicted in FIG. 1 is a brushless DC motor having a fixed shaft. However, the invention should not be construed to only be useful in conjunction with this type of motor. For example, the invention can be utilized in rotary shaft motors in the same manner as described herein.

The invention manifests itself as a combination of elements useful in simplifying the assembly of a disc drive assembly. As shown in FIG. 1, the internal electronics of the motor are connected to wires 20 and routed to a circuit board 22 via a slot 24 in the fixed shaft 26. Alternatively, a port in the shaft may be used. In the depicted motor, the electronics consist of the three phase stator windings 28. However, commutation control electronics or rotor position sensing electronics may also be contained within the motor. Access to these other electronic circuits can be accomplished in the same manner as will be described for connecting the stator windings to the drive circuits of motor 14.

Figure 2:
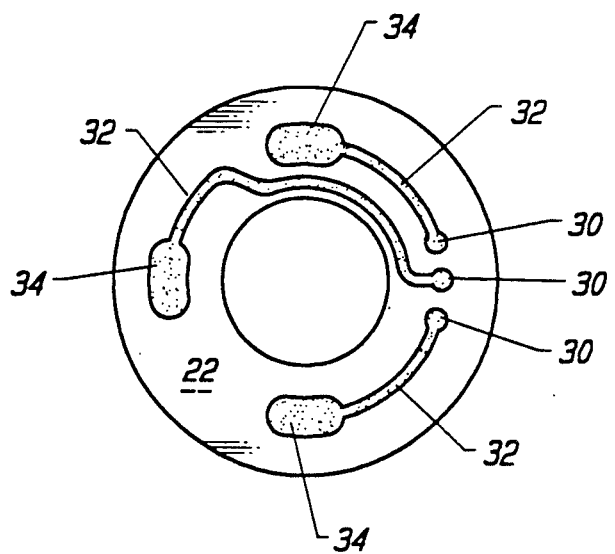
FIG. 2 depicts a circuit board which attaches to the disc drive motor having a pattern of metal contacts.

For a comprehensive view of circuit board 22, refer to FIG. 2. Therein is shown that wires 20 are connected to metal pads 30. Circuit traces 32 route the electrical signals to metal contacts 34. Preferably, the circuit board 22 is of annular shape and metal contacts 34 are arranged in a pattern distributing the contacts and metal pads equally about the annulus. However, metal contacts 34 may alternatively be distributed in any pattern. Additionally, the annular circuit board 22 could be formed in other shapes and remain functional.

Figure 3:
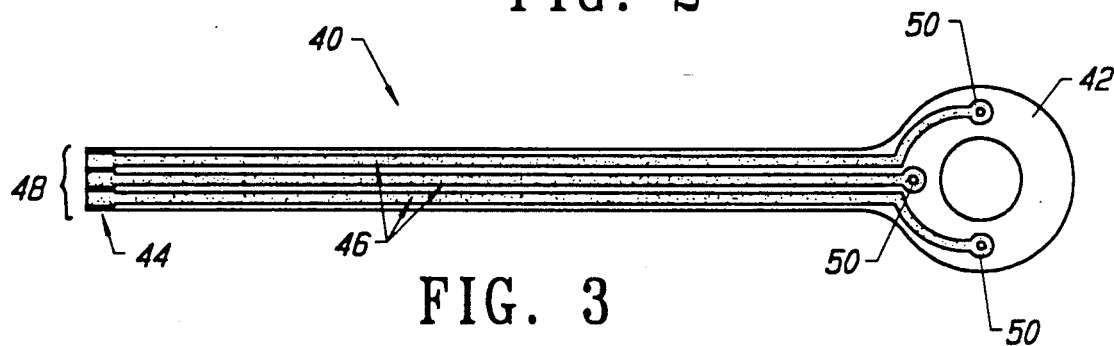
FIG. 3 shows a top view of the elongated, flexible printed circuit cable having patterned metal contacts which are aligned with the pattern of metal contacts in FIG. 2.

FIG. 3 depicts an elongated, flexible printed circuit cable 40. Cable 40 has a first end 42 and a second end 44 defining its length. First end 42 is annular in shape. Upon cable 40 are a number of conductive traces 46, also known as electrical traces or circuit traces. Traces 46 begin at second end 44 as contact pads 48 travel the length of cable 40, and terminate in metal contacts 50. The metal contacts 50 are distributed about the annular first end 42 in a pattern which matches the pattern of metal contacts 34 on circuit board 22. To enhance the conductive contact between metal contacts 34 and metal contacts 50, metal contacts 50 have protrusions 52 centered on each metal contact 50. These protrusions are preferably formed using an extrusion die and extruding the flat metal contact into a bump-shaped protrusion. Alternatively, the protrusions 52 can be formed by soldering a bump-shaped conductive portion to the flat metal contact.

Figure 4:
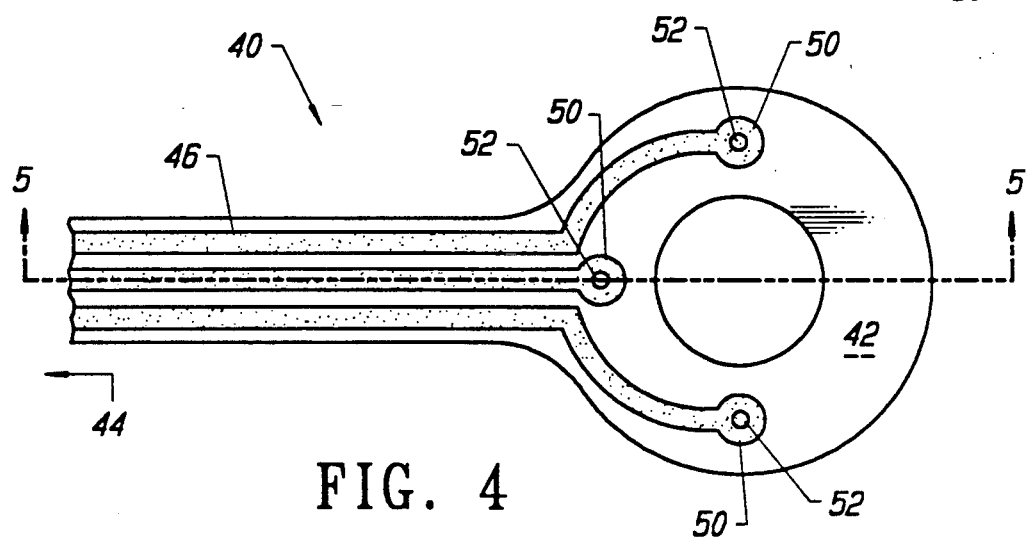
FIG. 4 depicts a close up of the first end of FIG. 3.
Figure 5:
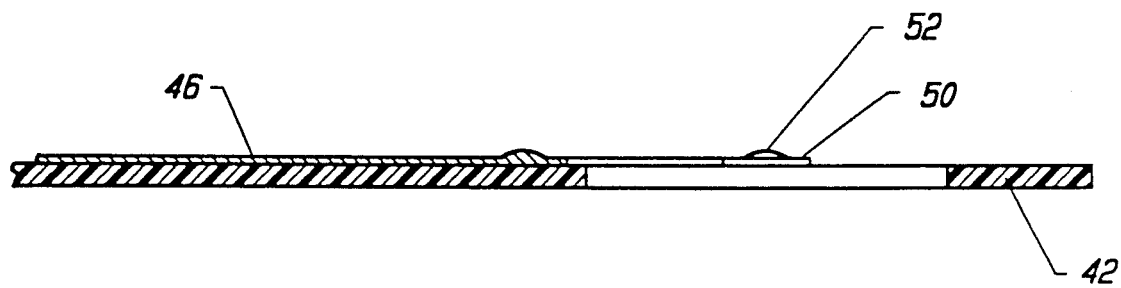
FIG. 5 shows a cross sectional view of FIG. 4.

FIG. 4 depicts first end 42 in a close up. Note protrusions 52 centered in metal contacts 50. FIG. 5 shows a cross section of FIG. 4, illustrating the form of protrusions 52.

Figure 6:
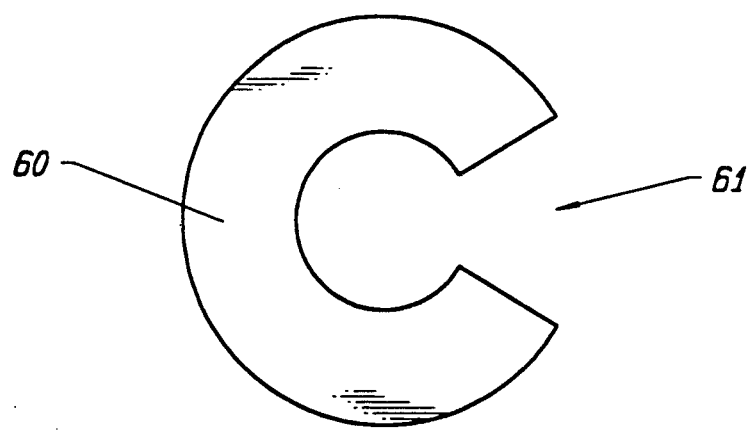
FIG. 6 depicts the means for providing compressive force which is a C-shaped foam portion in the preferred embodiment.

Referring to FIG. 1, protrusions 52 form a conductive connection between the traces 46 on cable 40 and the wires 20 attached to the metal contacts 34. To maintain this conductive connection, a force must be applied to the annular end 42 of cable 40 to press contacts 34 and 50 together. A means for providing compressive force is positioned beneath annular end 42. Preferably, the means is a partial ring of cellular polyurethane foam 60 having a low compression set throughout the entire operating temperature range of the disc drive. However, other materials are suitable in providing the compressive force. FIG. 6 depicts C-shaped portion 60. The cut-away portion 61 is aligned with the metal pads to which the motor electronics wiring 20 is soldered.

In use, cable 40 is attached by acrylic pressure sensitive adhesive or the like to the top of the foam portion 60. Through experimentation it has been found that attaching the foam stock to the flex cable and then cutting the single part to form the annular-shaped end is best. Motor 14 is positioned over cable 40 such that metal contacts 34 are aligned with protrusions 52. Additionally, the motor shaft 26 extends through cable 40 and portion 60. The bottom or base 23 of the motor and the base of the shaft 26 rests against the base deck 12 and a means for securely attaching motor 14 to base deck 12 is used. Preferably, the means is a single screw which extends through the base deck 12 and into the motor shaft 26. Alternatively, if the motor had a rotating shaft, a number of screws could be used to secure the base of the motor to the base deck.

Once the motor is secured, the foam portion 60 is compressed and it applies a uniform force to the annular end 42 of the printed circuit cable 40 to maintain contact between the protrusions 52 and the metal contacts 34. Current to drive the motor is applied by the external drive electronics to the pads 48 on the second end 44 of the cable 40. These currents are efficiently transferred to the stator windings 28 via the inventive compression connector. In the depicted motor, the current is supplied to internal motor electronics consisting of three stator windings 28. However, commutation control electronics or rotor position sensing electronics may also be contained within the motor. Access to these other electronic circuits can be accomplished with the present invention.

The invention enables the motor to be constructed as a single, self contained unit. One advantage is that no wires or cables are necessary to connect the motor to the disc drive assembly or to a test fixture in the laboratory. Thus, the base deck can be preassembled and cabled with the printed circuit cable. The motor can then be quickly and easily installed with a single attachment and no soldering.

The advantage of a single motor attachment screw is realized because the utilization of the invention eliminates the need to extend the port in the shaft out the bottom of the shaft. The use of a single attachment screw improves production time and reduces hardware costs.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. In a disc drive, a compression contact electrical connector assembly for connecting at least one external electrical circuit to a disc drive motor comprising:
   an elongated, flexible printed circuit cable having a first end and a second end defining a length;
   said first end having a pattern of metal contacts;
   electrical traces connected to said pattern of metal contacts and extending to said second end of said printed circuit cable, said electrical traces at said second end of said printed circuit cable being connected to said external electrical circuit;
   said disc drive motor having a pattern of metal contacts attached to a circuit board and aligned with said pattern of metal contacts on said first end of said printed circuit cable, said pattern of metal contacts on said motor being connected to electronic circuitry within said motor; and
   a means for providing compressive force to said first end of said printed circuit cable such that said pattern of metal contacts on said motor are compressively connected to said pattern of metal contacts on said first end of said printed circuit cable.

2. In the compression contact electrical connector assembly of claim 1, wherein said first end of said printed circuit cable is annular shaped.

3. In the compression contact electrical connector assembly of claim 1, wherein said first end of said printed circuit cable is annular shaped and wherein said motor has a fixed shaft which extends through said annular shaped first end.

4. In the compression contact electrical connector assembly of claim 1, wherein said motor includes a fixed shaft and said fixed shaft is attached to said base deck by a single fastener.

5. In the compression contact electrical connector assembly of claim 1, wherein said pattern of metal contacts on said first end of said printed circuit cable and said pattern of contacts on said motor are gold plated.

6. In the compression contact electrical connector assembly of claim 1, wherein said means for providing compressive force has a C shape.

7. In the compression contact electrical connector assembly of claim 1, wherein said means for providing compressive force is constructed of cellular polyurethane.

8. The compression contact electrical connector assembly of claim 1, wherein said compressive force means is positioned upon a disc drive assembly base deck;

said first end of said printed circuit cable positioned upon said compression force means; and said disc drive motor is fixedly attached to said base deck compressing said compressive force means.

9. In the compression contact electrical connector assembly of claim 8, wherein said pattern of metal contacts on said annular shaped first end of said printed circuit cable are distributed evenly about said annular shape.

10. In the compression contact electrical connector assembly of claim 1, wherein each metal contact of said pattern of metal contacts on said first end of said printed circuit cable has a metal protrusion.

11. In the compression contact electrical connector assembly of claim 10, wherein said protrusions are extruded from said metal contacts.

12. A compression contract electrical connector assembly for use in a disc drive for connecting at least one external electrical circuit to a disc drive motor, the connector assembly comprising an elongated flexible printed circuit cable having a first end and a second end defining a length, said first end having a pattern of metal contacts and being annular in shape, each of said contacts on said first end having a metal protrusion, said motor having a fixed shaft which extends through said annular shape first end, electrical traces connected to said pattern of metal contacts and extending to said second end of said printed circuit cable, said electrical traces at said second end of said printed circuit cable being adapted to be connected to an electrical connector for connection to said external printed circuit, said pattern of metal contacts being aligned with a corresponding pattern of metal contacts attached to a printed circuit board in said motor, said annular end of said printed circuit cable being responsive to compressive force on said first end of said cable such that said pattern of said metal contacts on said motor are compressively connected to said pattern of metal contacts on said first end of said printed circuit cable.

* * * * *